United States Patent
Kwong et al.

(10) Patent No.: US 9,929,036 B2
(45) Date of Patent: Mar. 27, 2018

(54) SYSTEM AND METHOD FOR PEELING A SEMICONDUCTOR CHIP FROM A TAPE USING A MULTISTAGE EJECTOR

(71) Applicant: Manufacturing Integration Technology Ltd, Singapore (SG)

(72) Inventors: Kim Mone Kwong, Singapore (SG);
Kok Yeow Lim, Singapore (SG);
Zhiqiang Mao, Singapore (SG)

(73) Assignee: MANUFACTURING INTEGRATION TECHNOLOGY LTD, Singapore (SG)

( * ) Notice: Subject to any disclaimer, the term of this patent is extended or adjusted under 35 U.S.C. 154(b) by 0 days.

(21) Appl. No.: 15/319,259

(22) PCT Filed: May 13, 2015

(86) PCT No.: PCT/SG2015/050109
§ 371 (c)(1),
(2) Date: Dec. 15, 2016

(87) PCT Pub. No.: WO2015/195045
PCT Pub. Date: Dec. 23, 2015

(65) Prior Publication Data
US 2017/0133259 A1   May 11, 2017

(30) Foreign Application Priority Data

Jun. 18, 2014 (SG) .............................. 10201403372S

(51) Int. Cl.
*H01L 21/683* (2006.01)
(52) U.S. Cl.
CPC ...... *H01L 21/6836* (2013.01); *H01L 21/6838* (2013.01); *H01L 2221/68322* (2013.01);
(Continued)

(58) Field of Classification Search
CPC . H01L 2221/68386; H01L 2221/68322; H01L 2221/68336; H01L 2221/68354;
(Continued)

(56) References Cited

U.S. PATENT DOCUMENTS 6,824,643 B2   11/2004   Yoshimoto
7,238,258 B2   7/2007   Park
(Continued)

OTHER PUBLICATIONS

International Preliminary Report in Patentability corresponding application PCT/SG2015/050109 filed May 13, 2015; dated Oct. 17, 2016.
(Continued)

*Primary Examiner* — Mark A Osele
(74) *Attorney, Agent, or Firm* — Cantor Colburn LLP

(57) ABSTRACT

A system and method for peeling a semiconductor chip from a tape using a multistage ejector is disclosed. A housing in the multistage ejector houses a plural sets of tape removing contacts. A pick and place unit is moved slowly to have contact with the chip. A vacuum source is utilized for generating vacuum to suck the tape. Plural sets of contacts such as inner, middle and outer contacts are independently or together moved below the tape at various stages by utilizing their respective actuation mechanism. A controller can independently control the movements of each contact to effectively remove or loosen the tape from the chip. A pick and place unit can then pick up the chip easily without any damage to chip.

11 Claims, 20 Drawing Sheets

(52) U.S. Cl.
CPC ............ *H01L 2221/68327* (2013.01); *H01L 2221/68336* (2013.01); *H01L 2221/68354* (2013.01); *H01L 2221/68386* (2013.01); *Y10S 156/932* (2013.01); *Y10S 156/943* (2013.01); *Y10T 156/1132* (2015.01); *Y10T 156/1179* (2015.01); *Y10T 156/1944* (2015.01); *Y10T 156/1983* (2015.01)

(58) Field of Classification Search
CPC ............ Y10S 156/932; Y10S 156/943; Y10T 156/1132; Y10T 156/1179; Y10T 156/1944; Y10T 156/1983
See application file for complete search history.

(56) References Cited

U.S. PATENT DOCUMENTS

| | | | |
|---|---|---|---|
| 7,624,498 B2 | 12/2009 | Ko | |
| 7,759,164 B2* | 7/2010 | Maki | H01L 21/67132 156/66 |
| 8,221,583 B2* | 7/2012 | Min | H01L 21/67011 156/707 |
| 8,250,742 B2* | 8/2012 | Kloeckner | H01L 21/67132 29/739 |
| 8,470,130 B2* | 6/2013 | Chong | H01L 21/67011 156/707 |
| 9,039,867 B2* | 5/2015 | Barmettler | H01L 21/67005 156/716 |
| 2008/0086874 A1* | 4/2008 | Cheung | H01L 21/67132 29/762 |
| 2008/0318346 A1* | 12/2008 | Maki | H01L 21/67132 438/7 |
| 2009/0101282 A1 | 4/2009 | Fujino | |
| 2010/0252205 A1* | 10/2010 | Chan | H01L 21/67132 156/758 |
| 2011/0192547 A1 | 8/2011 | Yip | |

OTHER PUBLICATIONS

International Search Report for corresponding application PCT/SG2015/050109 filed May 13, 2015; dated Aug. 10, 2015.
Demand to IPEA with Response to the Written Opinion of the ISA for corresponding application PCT/SG2015/050109 filed May 13, 2015; dated Feb. 19, 2016.
Response to the Written Opinion of the IPEA for corresponding application PCT/SG2015/050109 filed May 13, 2015; dated Sep. 19, 2016.

* cited by examiner

SYSTEM AND METHOD FOR PEELING A SEMICONDUCTOR CHIP FROM A TAPE USING A MULTISTAGE EJECTOR

TECHNICAL FIELD

The present disclosure relates generally to semiconductor chips. Embodiments of the disclosure are related to a system and method for peeling semiconductor chips from a tape using a multistage ejector.

BACKGROUND

In fabrication of semiconductor chips, various processing steps are carried out simultaneously on a single wafer to produce the desired semiconductor Integrated Circuit (IC). Typically, ICs are produced in large batches on a single wafer of Electronic-Grade Silicon (EGS) or other semiconductor material through the processes such as photolithography. The wafer is cut ("diced") into many pieces, each containing one copy of the circuit. The process of cutting the wafer is called dicing or singulation and each piece is called a die or chip.

During the singulation process, it is necessary to protect the chips from damage, as isolation of individual chips from wafer may cause damage to the chips. To protect a chip and to reduce such damage, normally an adhesive tape is first applied to the bottom surface of the wafer before singulation. After the singulation process, the adhesive tape is removed from the chip. Removal of an adhesive tape from a thin die (for example, of minimum thickness 40 μm) is subjected to die cracking and results in production loss. Various methods have been attempted in prior arts to overcome this problem.

In a US patent application US 2009/0101282 A1, an apparatus and method for picking-up a semiconductor die is disclosed. The apparatus and method uses a wiper that has a tip end moving in and out of an adherence surface of a die stage and a shutter that is moved with the wiper while blocking a suction window formed in the adherence surface. When picking up a semiconductor die, the tip end of the wiper is aligned with a first end of the die, the wiper is moved along the adherence surface while the tip end of the wiper is protruded from the adherence surface with the die being suction-held by a collect. A suction opening is sequentially opened between a first end surface of the suction window and a seat surface of the wiper as the wiper is moved, and a dicing sheet attached to the die is suctioned into the suction opening that has been opened and sequentially peeled off from the die. In this art, the wiper sliding speed must be slower than the propagation speed of the delamination process and the delamination process has to propagate from one side to another. Therefore, the circle time is limited.

U.S. Pat. No. 7,238,258 discloses a system for peeling semiconductor chips from a tape. The system is provided with a nose on a housing. The nose has transverse dimensions smaller than the transverse dimensions of a target chip. Apertures are provided through the nose from the housing. Vacuum ports are provided in the housing adjacent the nose. A vacuum source controllably connects to the apertures and the vacuum ports. The nose is positioned adjacent to a tape attached on the side opposite to the target chip. Vacuum is applied to attract the tape against the nose and the adjacent portions of the housing to peel the tape from the peripheral edges of the target chip while supporting the tape in the center of the target chip.

In this prior art, the vertical ejection tools include push-up needles and push-up two staged blocks. Since all the needles are moved simultaneously, it creates a high pressure at the center of the chip before it is peeled, thus increasing the likelihood of the chip to be damaged. Additionally, the angle between the slanting tape and the chip surface is small, which may lead to reduced process flows and ejection sequences.

A need, therefore, exists for an improved system and method for peeling a semiconductor chip from a tape that overcomes the above drawbacks.

SUMMARY

The following summary is provided to facilitate an understanding of some of the innovative features unique to the disclosed embodiment and is not intended to be a full description. A full appreciation of the various aspects of the embodiments disclosed herein can be gained by taking into consideration the entire specification, claims, drawings, and abstract as a whole.

It is, therefore, one aim of the disclosed embodiments to provide for a system for peeling a semiconductor chip from a tape. The system includes a housing having a top surface such that the top surface is positioned under the tape on which the chip is attached, a plural sets of tape removing contacts provided at the center of the top surface of the housing such that each of the plural sets of tape removing contacts is capable of moving independently or together with the other sets, a plurality of vacuum channels surrounding the plural sets of tape removing contacts, a vacuum source coupled to the plurality of vacuum channels for creating a vacuum to hold the tape firmly, and a controller for controlling the vacuum source and the plural sets of tape removing contacts, such that the chip is removed from the tape due to the synchronous movement of the plural sets of tape removing contacts once the vacuum source is turned on.

It is another aim of the disclosed embodiments the plural sets of tape removing contacts include an inner set of contacts located at the centre of the top surface of the housing, a middle set of contacts surrounding the inner set of contacts, and an outer set of contacts surrounding the middle set of contacts such that the controller triggers individual or collective movement of the inner set of contacts, middle set of contacts and outer set of contacts.

It is yet another aim of the disclosed embodiments each set of the plural sets of tape removing contacts is coupled to a respective actuation mechanism that facilitates its movement based upon trigger received from the controller.

It is yet another aim of the disclosed embodiments that the contacts of the plural sets of tape removing contacts includes at least one of pins or needles.

It is yet another aim of the disclosed embodiments to provide a pickup and place unit operatively coupled to the free surface of the chip such that the pickup and place unit removes the chip from the tape once the chip is loosened from the tape.

It is another aim of the disclosed embodiments to provide a housing which is a pepper pot.

It is another aim of the disclosed embodiments to provide the plurality of vacuum channels which are concentric in shape.

It is another aim of the disclosed embodiments to provide for a method for peeling a semiconductor chip from a tape. The method includes the steps of placing plural sets of tape removing contacts under the tape on which the chip is attached such that the plural sets of tape removing contacts are in a non-activated position, coupling a pickup and place unit to the free surface of the chip, creating a vacuum for holding the tape firmly to the top surface of a housing, moving the plural sets of tape removing contacts upwards by a first predefined distance, simultaneously, moving the pickup and place unit upwards by the first predefined distance, selectively moving at least one set of the plural sets of tape removing contacts downwards to effectively loosen the tape from the chip in steps till all the sets of the plural sets of tape removing contacts are moved downwards, and removing the chip using the pickup and place unit after all the sets of the plural sets of tape removing contacts are moved downwards.

It is yet another aim of the disclosed embodiments to provide a method for peeling a semiconductor chip from a tape. The method includes the steps of placing plural sets of tape removing contacts under the tape on which the chip is attached such that the plural sets of tape removing contacts are in a non-activated position, coupling a pickup and place unit to the free surface of the chip, creating a vacuum for holding the tape firmly to the top surface of a housing, moving the plural sets of tape removing contacts upwards by a first predefined distance, moving, simultaneously, the pickup and place unit upwards by the first predefined step, moving the plural sets of tape removing contacts further upwards in steps of a second predefined distance such that in each step, the number of plural sets of tape removing contacts is reduced by one compared to the previous step, and removing the chip using the pickup and place unit when only the last set of the plural sets of tape removing contacts is attached to the tape.

It is yet another aim of the disclosed embodiments to provide a method for peeling a semiconductor chip from a tape. The method includes the steps of placing plural sets of tape removing contacts under the tape on which the chip is attached such that the plural sets of tape removing contacts are in a non-activated position, coupling a pickup and place unit to the free surface of the chip, creating a vacuum for holding the tape firmly to the top surface of a housing, moving alternate sets of the plural sets of tape removing contacts upwards by a first predefined distance, simultaneously, moving the pickup and place unit upwards by the first predefined distance, selectively moving at least one set of the upward moved alternate sets of the plural sets of tape removing contacts downwards to effectively loosen the tape from the chip in steps till all the upward moved alternate sets of the plural sets of tape removing contacts are moved downwards, and removing the chip using the pickup and place unit after all the sets of the plural sets of tape removing contacts are moved downwards.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the disclosure is not limited to specific methods and instrumentalities disclosed herein. Moreover, those in the art will understand that the drawings are not to scale. Wherever possible, like elements have been indicated by identical numbers.

DETAILED DESCRIPTION OF ILLUSTRATIVE EMBODIMENTS

The particular configurations discussed in the following description are non-limiting examples that can be varied and are cited merely to illustrate at least one embodiment and are not intended to limit the scope thereof.

The present disclosure provides a system and method for peeling a semiconductor chip from a tape using a multistage ejector. The multistage ejector is utilized to loosen the tape from the chip which is to be removed, following which, a pickup and place unit removes the chip from the tape. A housing of the multistage ejector houses a plural sets of tape removing contacts which are positioned under the tape to which the chip is attached. In an embodiment, the plural sets of tape removing contacts include an inner set of contacts, a middle set of contacts and an outer set of contacts. These three sets of tape removing contacts may move independently or together under the tape. A vacuum is created in the housing to suck the tape to the housing while the plural sets of tape removing contacts are moved which leads to loosening of the tape from the chip after which the chip is removed.

Figure 1:
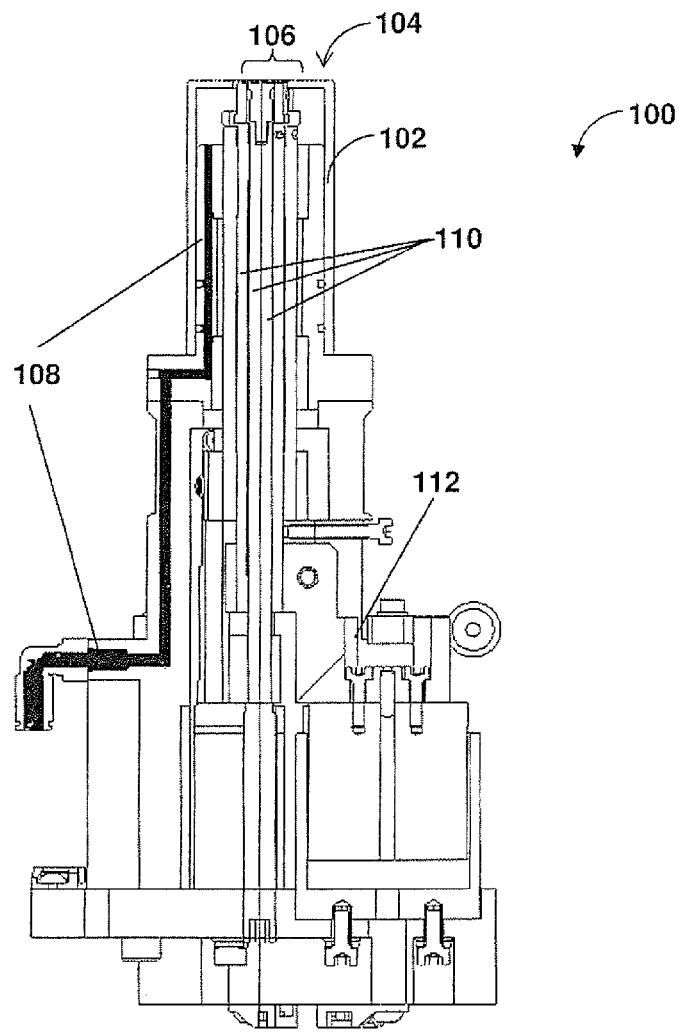
FIG. 1 is an illustration of a side view of a multistage ejector utilized for peeling a semiconductor chip from a tape, in accordance with the disclosed embodiments.

Referring to FIG. 1, a side view of a multistage ejector 100 is shown. The multistage ejector 100 includes a housing 102 with a top surface 104. In an embodiment, the housing 102 maybe a pepper pot. An assembly of plural sets of tape removing contacts 106 is mounted on the actuator of the multistage ejector 100. The multistage ejector 100 has vacuum connections 108, and a number of actuator connections 110 for example, connection of an actuation mechanism to its respective tape removing contacts. In an embodiment, the plural sets of tape removing contacts 106 include an inner set of contacts, a middle set of contacts and an outer set of contacts. Though the present invention is described using three sets of tape removing contacts, it is possible to implement the teachings of the present invention using two or more sets of tape removing contacts in order to achieve required multi-stage ejections for easily and effectively removing the tape from the chip.

The vacuum connections 108 connect a plurality of vacuum channels (shown in FIG. 2) to a vacuum source (not shown in figure). The vacuum source creates a vacuum in the housing 102 through the vacuum connections 108, as shown in FIG. 1. An actuation mechanism 112 is connected to the outer set of contacts via the one of the actuator connections 110 to drive the outer set of contacts to the required position by moving it upwards or downwards. Similarly, the inner set and the middle set of contacts are driven by their respective actuation mechanisms (not shown in figure) to move them upwards or downwards as desired. The vacuum source and each of the actuation mechanisms are controlled by a controller (not shown in figure) which sends instructions for their functioning. For example, the controller may send a trigger to the vacuum source to turn it on. In accordance with another example, the controller may trigger the actuation mechanism 112 to move the outer set of contacts upwards. It may be noted that only the essential components of the multistage ejector 100 are described for clarity and any additional elements can be used which are in line with the teachings of the present invention.

Figure 2:
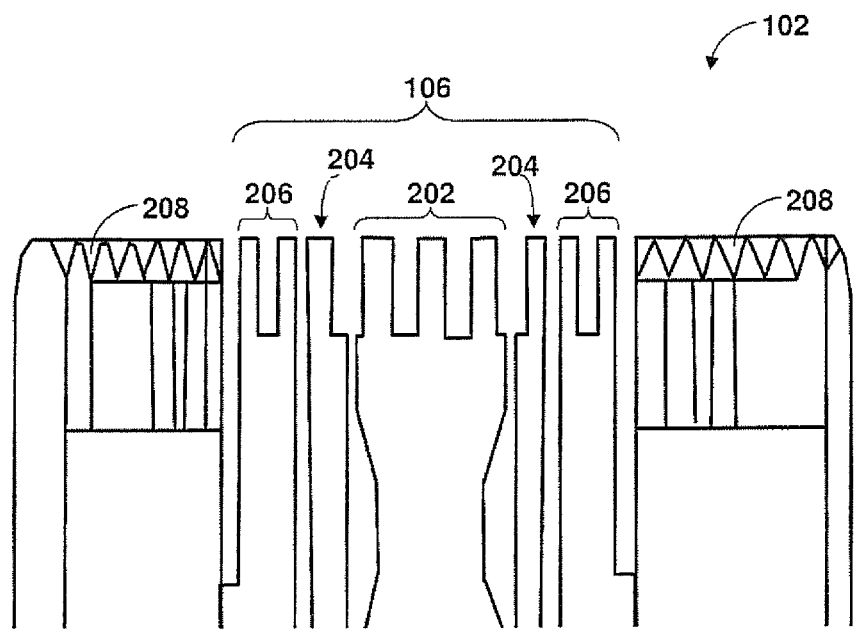
FIG. 2 is an illustration of a side view of a housing of a multistage ejector, in accordance with the disclosed embodiments.

FIG. 2 illustrates a perspective view of the housing 102 of the multistage ejector 100 depicted in FIG. 1. The housing 102 includes a plural sets of tape removing contacts 106 and a plurality of vacuum channels 208. The plural sets of tape removing contacts 106 are placed at the center of the housing 102 for facilitating maximum suction of a tape under which the top surface 104 is positioned. However, the plural sets of tape removing contacts 106 can be placed radially too. The vacuum channels 208 are adjacent to the plural sets of tape removing contacts 106 such that the vacuum channels 208 surround the plural sets of tape removing contacts 106. In an exemplary embodiment, the plural sets of tape removing contacts 106 include an inner set of contacts 202, middle set of contacts 204 and outer set of contacts 206. It is possible to implement the teachings of the present invention with more sets of contacts. The contacts are made of Brass and have very small width. As an example, the contacts may be pins rather than needles to avoid problems of damaging chips. Each set of contacts can move independently or collectively with other sets of contacts. The inner set of contacts 202, middle set of contacts 204 and outer set of contacts 206 are moved via their respective actuation mechanisms controlled by the controller.

In an exemplary embodiment, the inner set of contacts 202, middle set of contacts 204 and outer set of contacts 206 are placed as follows: the inner set of contacts 202 is placed at the center of the top surface 104 of the housing 102 surrounded by the middle set of contacts 204 which are in turn surrounded by the outer set of contacts 206. The plural sets of tape removing contacts 106 can take any shape facilitating easy removal of the tape from the bottom surface of the chip and include without limitation, round, square, rectangular, etc. The top surface 104 is positioned under the tape to which a chip is attached and needs to be peeled.

Figure 3:
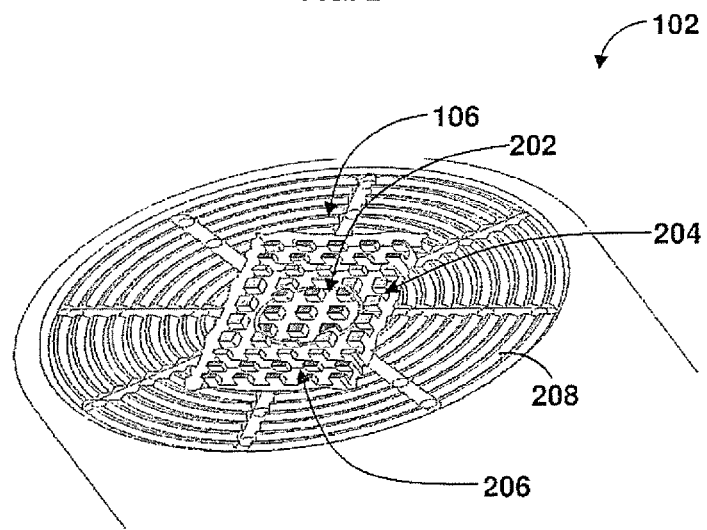
FIG. 3 is an illustration of a perspective view of the housing depicted in FIG. 2, in accordance with the disclosed embodiments.

FIG. 3 is the top view of the housing 102. As explained in FIG. 2, it can be seen that the plural sets of tape removing contacts 106 as a single unit are positioned at the center of the top surface 104 of the housing 102. As an example, the inner set of contacts 202 are placed in a circle, the middle set of contacts 204 are placed in a square while the outer set of contacts 206 are placed in a rectangle. The vacuum channels 208 are provided as concentric circles along the diameter of the top surface 104 such that the vacuum channels 208 surround the plural sets of tape removing contacts 106 without any channels below. It should be noted that the vacuum channels under vacuum firmly holds the tape at the time of operating the plural sets of tape removing contacts 106.

Figure 4:
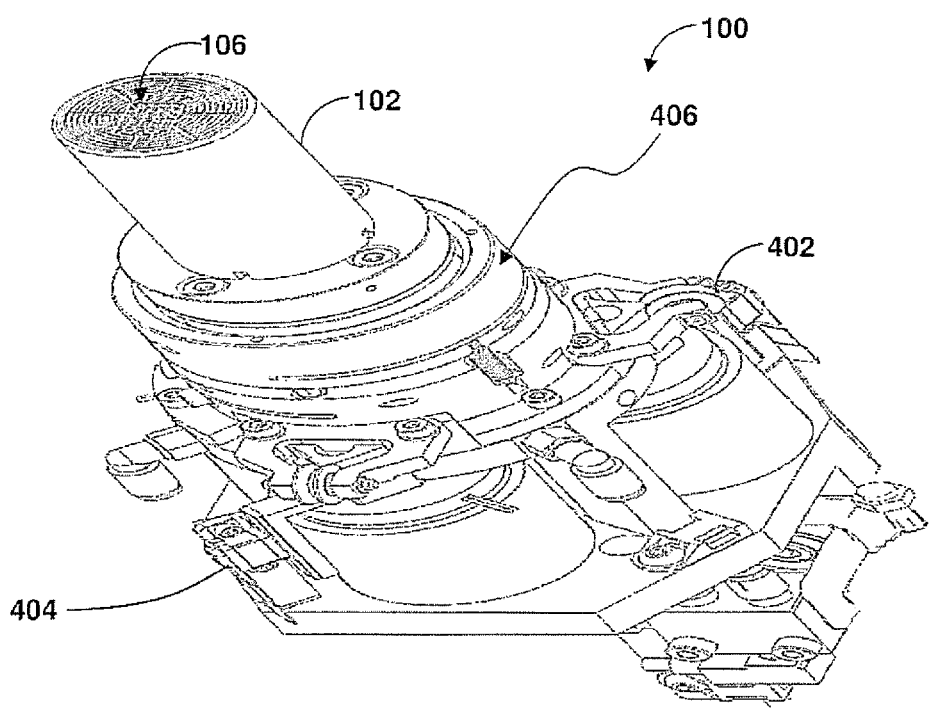
FIG. 4 is an illustration of a perspective view of the multistage ejector of FIG. 1, in accordance with the disclosed embodiments.

FIG. 4 is an illustration of a perspective view of the multistage ejector 100 with the plural sets of tape removing contacts 106 in a non-activated position, in accordance with the disclosed embodiments. In this figure, the multistage ejector 100 illustrates the housing 102 (pepper pot) and the plural sets of tape removing contacts 106 in the mounted state. In the non-activated state, the plural sets of tape removing contacts 106 are at the same plane as the top surface 104 of the housing 102 (pepper pot). Two of the three actuation mechanisms 402 and 404 are shown in the figure. In an embodiment, an actuation mechanism may be an encoder assembly. An encoder assembly may be a linear encoder assembly to provide accurate and high-speed movement of the plural sets of tape removing contacts 106. A crash detection unit 406 may detect any jam in the actuation mechanisms at any operational stage.

Figure 5:
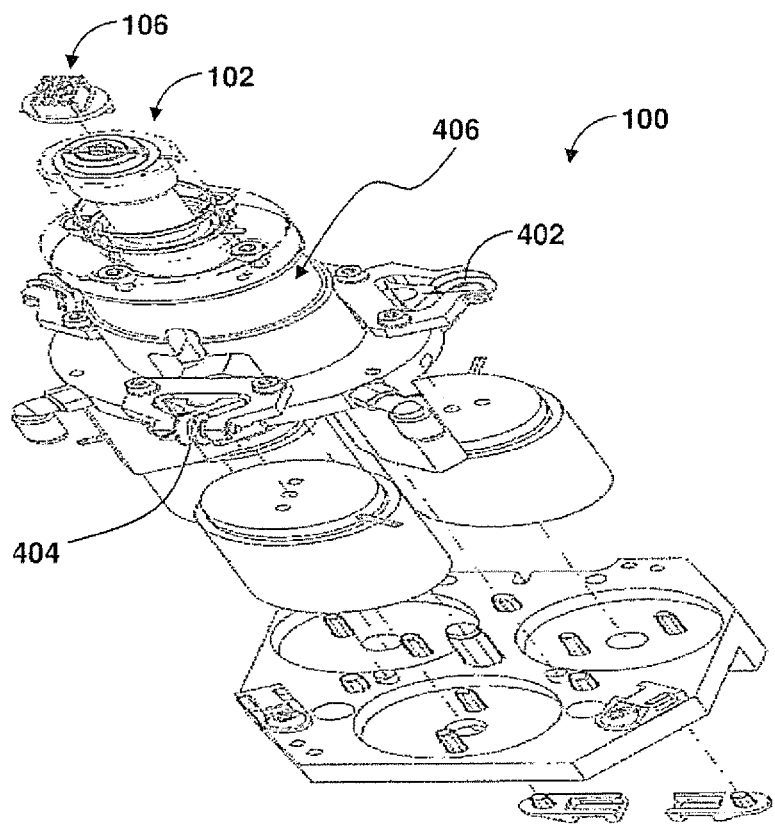
FIG. 5 is an illustration of an exploded view of the multistage ejector depicted in FIG. 1, in accordance with the disclosed embodiments.

Each actuation mechanism is capable of independently moving their respective set of contacts, for example, inner set of contacts 202, outer set of contacts 206 or middle set of contacts 204. It should be noted that the actuation mechanism controls individual movement of its contacts via software. For example, a controller may contain a set of instructions for operating each set of contacts of the plural sets of tape removing contacts 106 to remove or loosen the tape at the bottom of the chip. Once the tape is loosened, a pickup and place unit can easily collect the chip without causing any damage to the chip. The exploded view of multistage ejector 100 is shown in FIG. 5. A vacuum source (not shown) is utilized for generating vacuum to suck the tape.

Figure 6A:
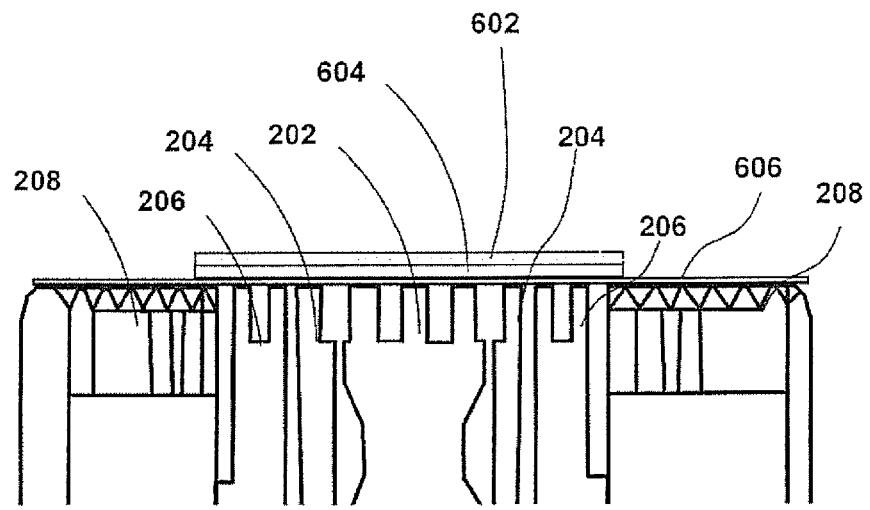
FIGS. 6A-6F are illustrations of various steps employed in peeling a semiconductor chip from a tape, in accordance with a first embodiment of the present invention.

FIGS. 6A-6F illustrate various steps involved in peeling a semiconductor chip 604 from a tape 606, in accordance with a first embodiment of the present invention. After the singulation process, each chip 604 has to be safely separated from an adhesive tape 606 to which it is attached. In accordance with disclosed embodiments, the chip 604 is removed using the multistage ejector 100 depicted in FIG. 1. The bottom surface of the chip 604 is attached to an adhesive tape 606 while its top surface is free and therefore, referred to as the free surface of the chip 604. As shown in FIG. 6A, the free surface of the chip 604 may be coupled to a pickup and place unit 602. The inner set, middle set and outer set of contacts 202, 204, and 206 respectively, of the plural sets of tape removing contacts 106 are positioned below the tape 606 at a place where the chip 604 is attached to the tape 606. Thus, a part of the tape 606 is sandwiched between the chip 604 and the plural sets of tape removing contacts 106. Below rest of the tape 606, vacuum channels 208 are positioned. At this stage, the inner set, middle set and outer set of contacts 202, 204 and 206 respectively, are in a non-activated position, say at the same plane as the vacuum channels.

Figure 6B:
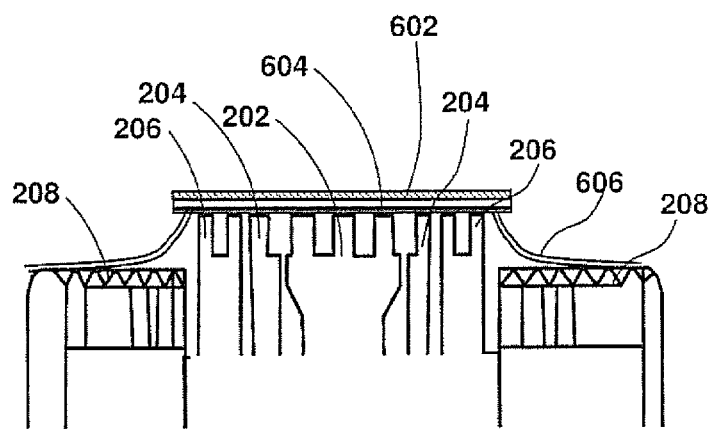

At the commencement of the chip peeling process, the vacuum source is turned ON. Then, as depicted in FIG. 6B, the inner, middle and outer sets of contacts 202, 204 and 206 are moved up along with the pickup and place unit 602 by a first predefined distance. In an embodiment, in stage one, the inner, middle and outer sets of contacts 202, 204 and 206 and the pickup and place unit are moved together to avoid damage to the chip 604. The movement of the inner, middle and outer sets of contacts 202, 204 and 206 respectively and the pickup and place unit may be triggered by the controller. As can be seen from the figure, due to vacuum, the ends of the tape 606 remain attached to the vacuum channels 208, when the inner, middle and outer sets of contacts 202, 204 and 206 positioned below the central portion of the tape 606 are elevated. Also, in this position, the tape 606 is loosened at the ends of the chip 604 and near the inner ends of the vacuum channels 208.

Figure 6C:
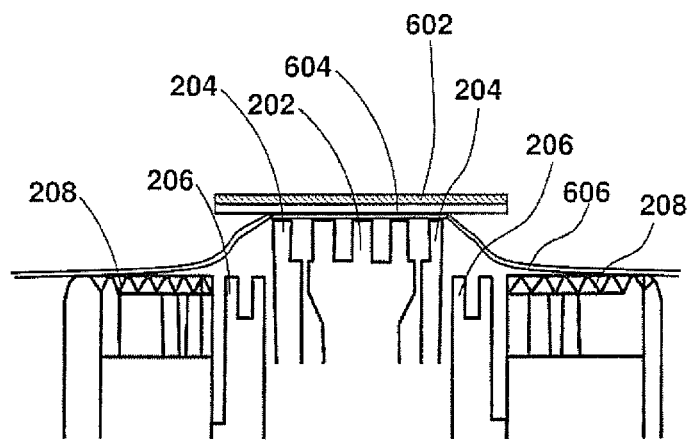
Figure 6D:
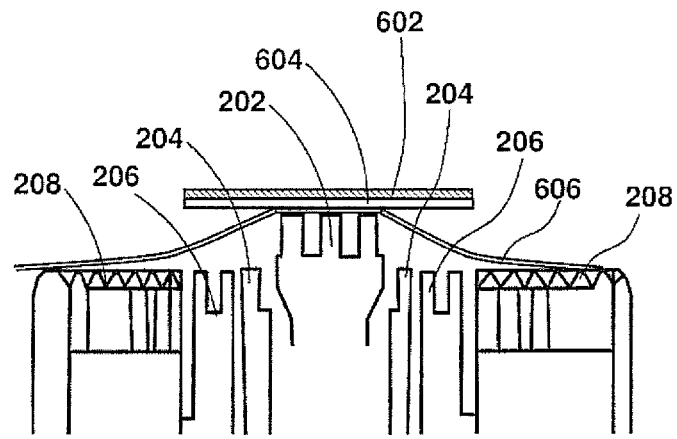
Figure 6E:
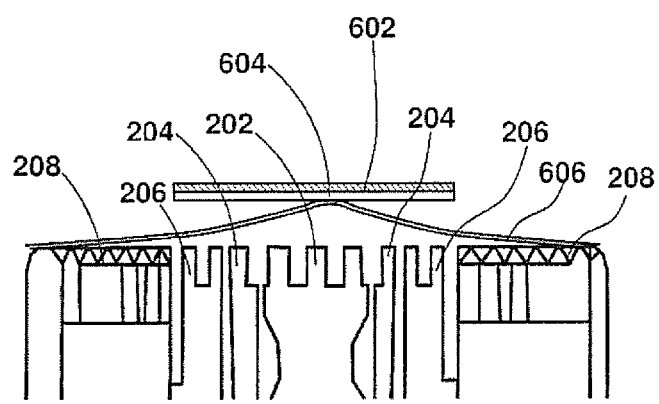
Figure 6F:
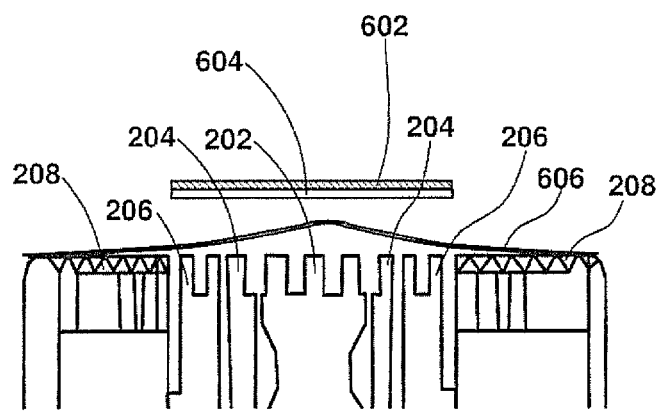

As a next step, shown in FIG. 6C, the outer set of contacts 206 is moved downwards by a predefined distance. Due to this, the portion of the tape 606 between the vacuum channels 208 and middle sets of contacts 204, is peeled/loosened from the chip 604. Then, as shown in FIGS. 6D-6E, the middle set of contacts 204 and the inner set of contacts 202 are moved down respectively, by the predefined distance to further loosen the tape 606 attached to the bottom surface of the chip 604. Once all the three set of contacts 202, 204 and 206 are moved down, the tape 606 is substantially peeled/loosened from the bottom surface of the chip 604 and finally as depicted in FIG. 6F, the pickup and place unit 602 may easily remove the chip 604 from the tape 606 without causing any damage to the chip. Moving down the inner, middle and outer sets of contacts 202, 204 and 206 one by one by the predetermined distance, finally keeps all the three contacts in the non-activated position.

It may be noted that by using the present invention, the pressure on the top surface of the chip is minimal as opposed to a single stage ejector. Also, the peeling angle (angle between the tape in most loosened position and the bottom surface of the chip) of the present invention is much larger ensuring easy removal of the chip.

Figure 7A:
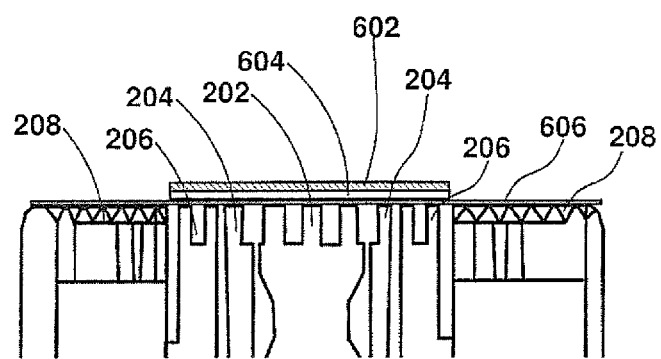
FIGS. 7A-7E are illustrations of various steps employed in peeling a semiconductor chip from a tape, in accordance with a second embodiment of the present invention.

FIGS. 7A-7E illustrate the various steps involved in peeling a semiconductor chip 604 from a tape 606, in accordance with a second embodiment of the present invention. As shown in FIG. 7A, the free surface of the chip 604 may be coupled to the pickup and place unit 602. The inner set, middle set and outer set of contacts 202, 204 and 206 respectively, of the plural sets of tape removing contacts 106 are positioned below the tape 606 at a place where the chip 604 is attached to the tape 606. Thus, a part of the tape 606 is sandwiched between the chip 604 and the plural sets of tape removing contacts 106. Below rest of the tape 606, vacuum channels 208 are positioned. At this stage, the inner set, middle set and outer set of contacts 202, 204 and 206 respectively, are in the non-activated position.

Figure 7B:
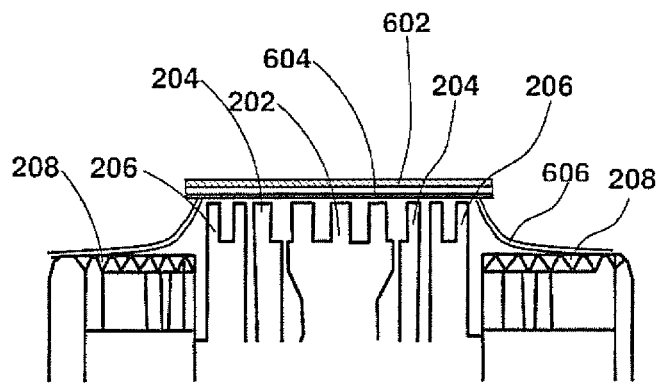
Figure 7C:
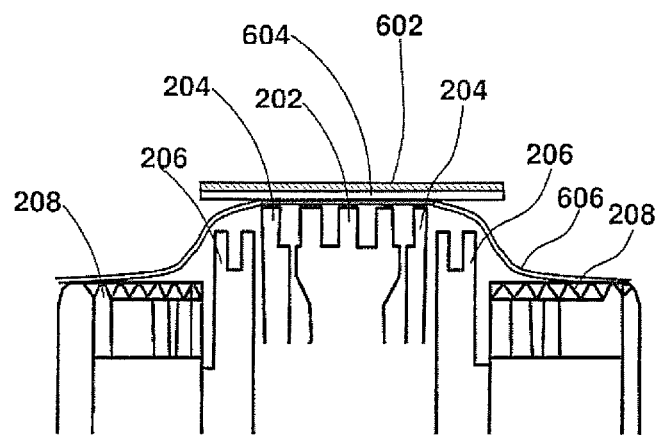
Figure 7D:
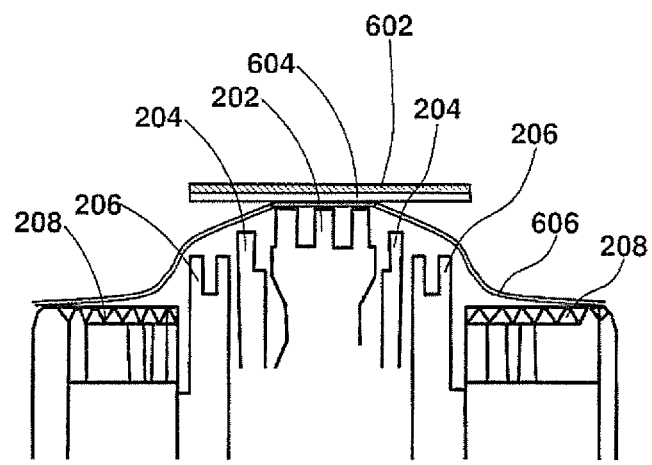
Figure 7E:
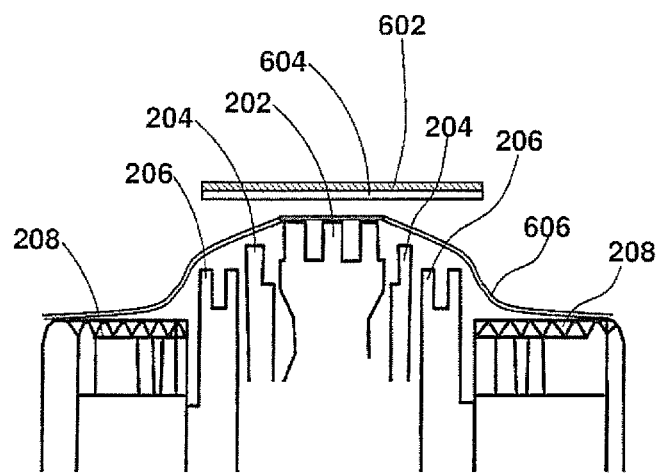

To commence the chip peeling process, the vacuum source (not shown) is turned ON. Then, as depicted in FIG. 7B, the inner set, middle set and outer set of contacts 202, 204 and 206 respectively are moved up by a first predefined distance along with the pickup and place unit 602. This peels the tape 606 at the ends of the chip 604. As shown in FIG. 7C, the middle set of contacts 204 and inner set of contacts 202 are moved up by a second predefined distance. This further peels the tape 606 from the chip 604. Finally, as depicted in FIG. 7D, the inner set of contacts 202 is moved up alone by the third predefined distance which further peels the tape 606 from the chip 604 and the pickup and place unit 602 removes the chip 604 from the tape 606 without damage in FIG. 7E. In an embodiment, the first, second and third predefined distances are for example, 1 mm.

Figure 8A:
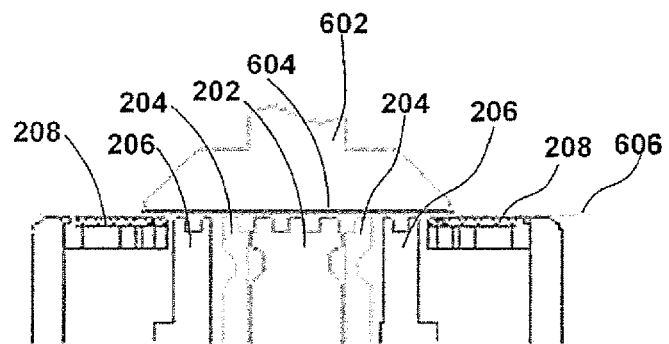
FIGS. 8A-8E illustrate the various steps involved in peeling a semiconductor chip from a tape, in accordance with a third embodiment of the present invention.

FIGS. 8A-8E illustrate the various steps involved in peeling a semiconductor chip 604 from a tape 606, in accordance with a third embodiment of the present invention. In this embodiment along with the actuation mechanisms, the plural sets of tape removing contacts 106 are connected to the vacuum source to hold the tape 606 at the time of moving the plural sets of tape removing contacts 106. As shown in FIG. 8A, the free surface of the chip 604 may be coupled to the pickup and place unit 602. The inner set, middle set and outer set of contacts 202, 204 and 206 respectively, of the plural sets of tape removing contacts 106 are positioned below the tape 606 at a place where the chip 604 is attached to the tape 606. Thus, a part of the tape 606 is sandwiched between the chip 604 and the plural sets of tape removing contacts 106. Below rest of the tape 606, vacuum channels 208 are positioned. At this stage, the inner set, middle set and outer set of contacts 202, 204 and 206 respectively, are in the non-activated position.

Figure 8B:
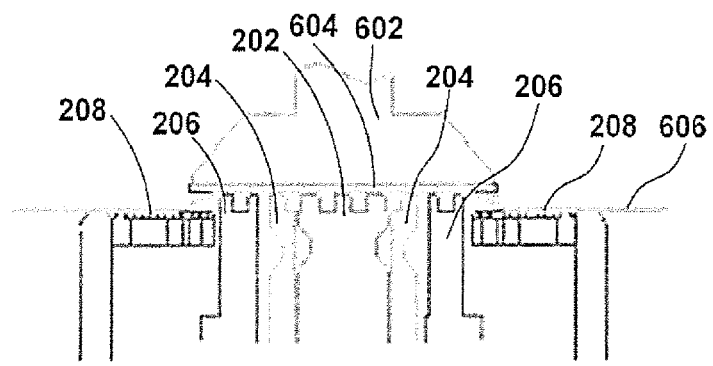
Figure 8C:
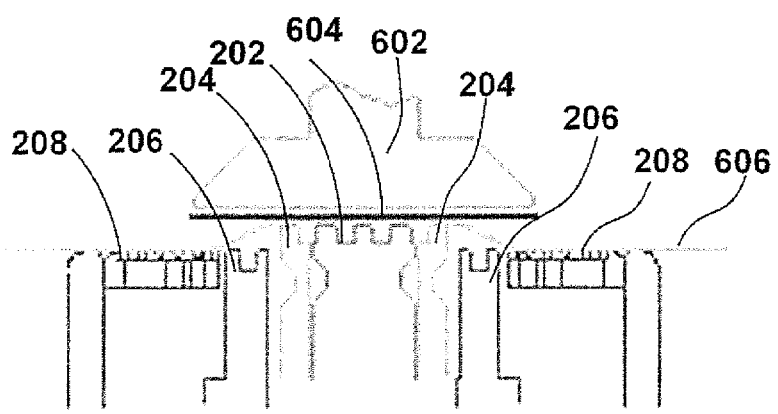
Figure 8D:
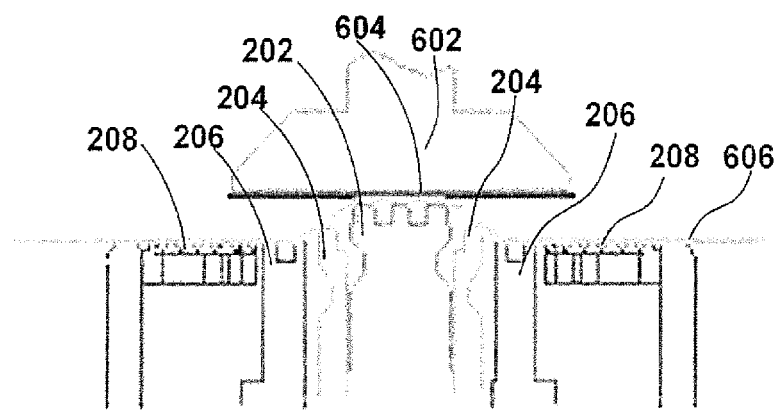
Figure 8E:
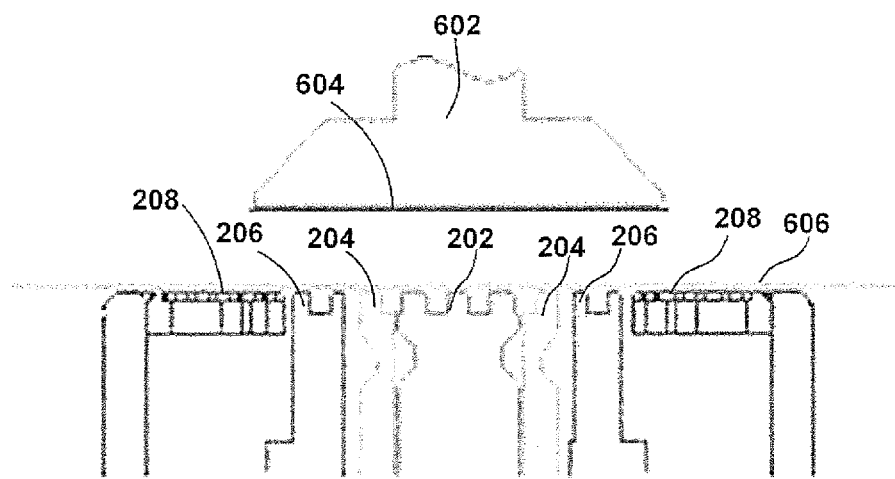

To commence the chip peeling process, the vacuum source (not shown) is turned ON. Then, as depicted in FIG. 8B, the inner set, middle set and outer set of contacts 202, 204 and 206 respectively are moved up by a first predefined distance along with the pickup and place unit 602. This loosens the tape 606 at the inner ends of the vacuum channels 208 and at the sides of the chip 604. In FIG. 8C, the outer set of contacts 206 is moved down by the first predefined distance and the inner and middle contacts 202 and 204 are again moved up by the second predefined distance. Due to this, the portion of the tape 606 corresponding to the width of the outer set of contacts 206 is peeled off from the bottom surface of the chip 604. The vacuum suction is increased on the outer set of contacts 206 to hold this peeled portion of the tape 606. In FIG. 8D, the inner set of contacts 202 is moved up by the third predefined distance further loosening the tape from the bottom surface of the chip 604. The vacuum suction is now increased on the middle set of contacts 204 to hold this further peeled portion of the tape 606. Finally, as depicted in FIG. 8E, the inner set of contacts 202 and the middle set of contract 204 are moved down such that all the three inner set, middle set and outer set of contacts 202, 204 and 206 respectively are in non-activated position. By moving the inner set of contacts 202 down, the tape 606 is removed from the bottom surface of the chip 604 and the pickup and place unit 602 can easy collect the chip 604 without damage.

Figure 9A:
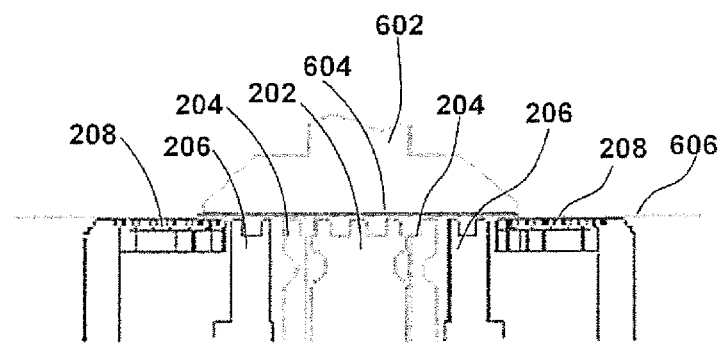
FIGS. 9A-9E illustrate the various steps involved in peeling a semiconductor chip from a tape, in accordance with a fourth embodiment of the present invention.

FIGS. 9A-9E illustrate the various steps involved in peeling a semiconductor chip 604 from a tape 606, in accordance with a fourth embodiment of the present invention. In this embodiment along with the actuation mechanisms, the plural sets of tape removing contacts 106 are connected to the vacuum source to hold the tape 606 at the time of moving the plural sets of tape removing contacts 106. As shown in FIG. 9A, the free surface of the chip 604 is coupled to the pickup and place unit 602. The inner set, middle set and outer set of contacts 202, 204 and 206 respectively, of the plural sets of tape removing contacts 106 are positioned below the tape 606 at a place where the chip 604 is attached to the tape 606. Thus, a part of the tape 606 is sandwiched between the chip 604 and the plural sets of tape removing contacts 106. Below rest of the tape 606, vacuum channels 208 are positioned. At this stage, the inner set, middle set and outer set of contacts 202, 204 and 206 respectively, are in the non-activated position.

Figure 9B:
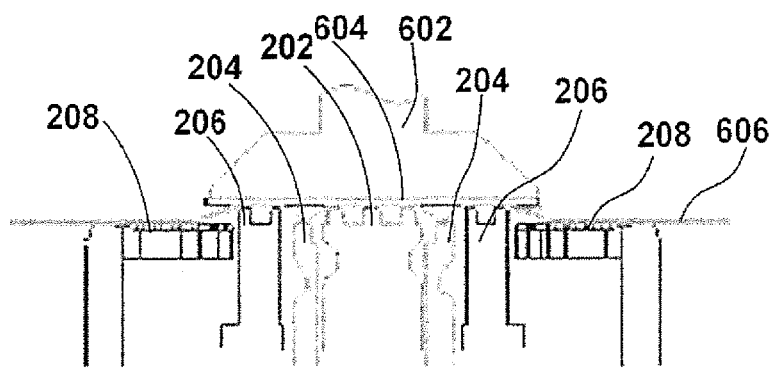
Figure 9C:
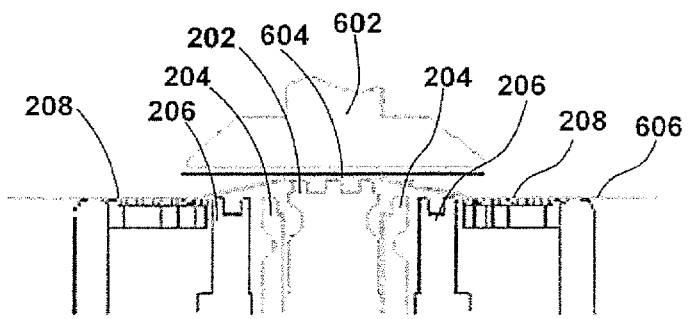
Figure 9D:
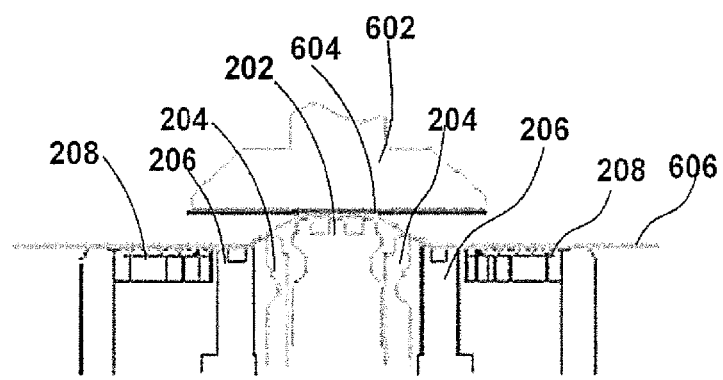
Figure 9E:
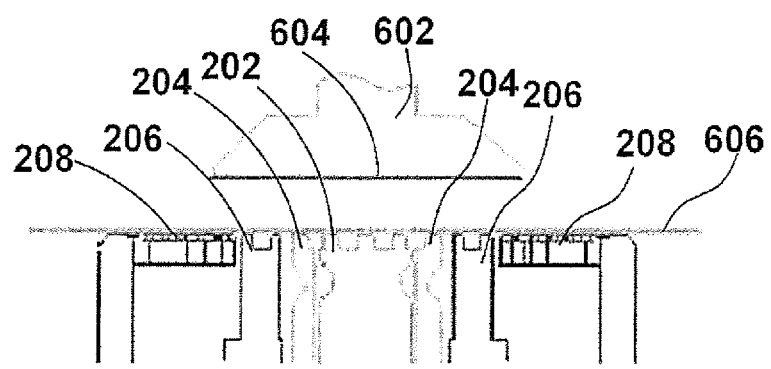

To commence the chip peeling process, the vacuum source (not shown) is turned ON. Then, as depicted in FIG. 9B, the inner set and the outer set of contacts 202 and 206 respectively are moved up by a first predefined distance along with the pickup and place unit 602. This peels the tape 606 at the sides of the chip 604 and at the portions of the bottom surface of the chip 604 which were coupled to the middle set of contacts 204 in the non-activated state. Further, due to the suction effect, the portion of the tape 606 coupled to the middle set of contacts 204 is still attached to the middle set of contacts 204 which are in non-activated position. In FIG. 9C the outer set of contacts 206 is moved down by the first predefined distance and inner set of contact 202 is moved up by the second predefined distance. Due to this, a substantial portion of the tape 606 corresponding to the width of the outer set of contacts 206 and middle set of contacts 204 is peeled off from the bottom surface of the chip 604. The middle set of contacts 204 is moved up by the first predefined distance and simultaneously the inner set of contacts 202 are moved up by the third predefined distance in order to attach the loosened portion of the tape 606 by holding it firmly by the suction effect as depicted in FIG. 9D. Finally, as depicted in FIG. 9E, the inner set of contacts 202 and the middle set of contacts 204 are moved down to the same position as in non-activated state, thereby, removing the tape 606 from the bottom surface of the chip 604 and the pickup and place unit 602 collects the chip 604 without damage.

Figure 10A:
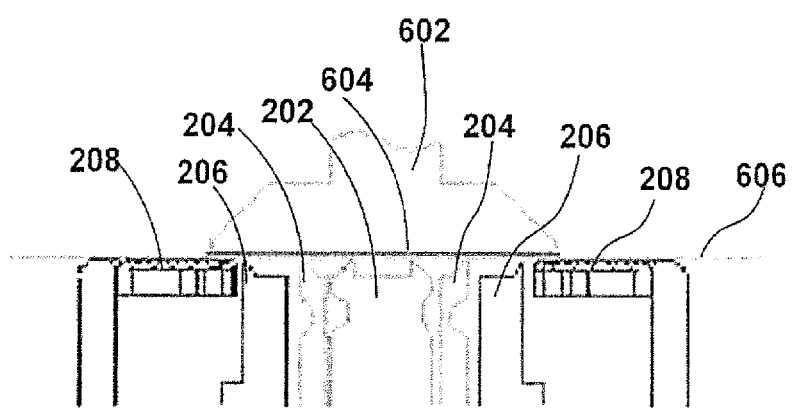
FIGS. 10A-10E illustrate the various steps involved in peeling a semiconductor chip from a tape, in accordance with a fifth embodiment of the present invention.

FIGS. 10A-10E illustrate the various steps involved in peeling a semiconductor chip 604 from a tape 606, in accordance with a fifth embodiment of the present invention. In this embodiment along with the actuation mechanisms, the plural sets of tape removing contacts 106 are connected to the vacuum source to hold the tape 606 at the time of moving the plural sets of tape removing contacts 106. As shown in FIG. 10A, the free surface of the chip 604 may be coupled to the pickup and place unit 602. The inner set, middle set and outer set of contacts 202, 204 and 206 respectively, of the plural sets of tape removing contacts 106 are positioned below the tape 606 at a place where the chip 604 is attached to the tape 606. Thus, a part of the tape 606 is sandwiched between the chip 604 and the plural sets of tape removing contacts 106. Below rest of the tape 606, vacuum channels 208 are positioned. The inner set, middle set and outer set of contacts 202, 204 and 206 respectively in this embodiment include one or more needles as opposed to pins depicted in above embodiments. At this stage, the inner set, middle set and outer set of contacts 202, 204 and 206 respectively, are in the non-activated position.

Figure 10B:
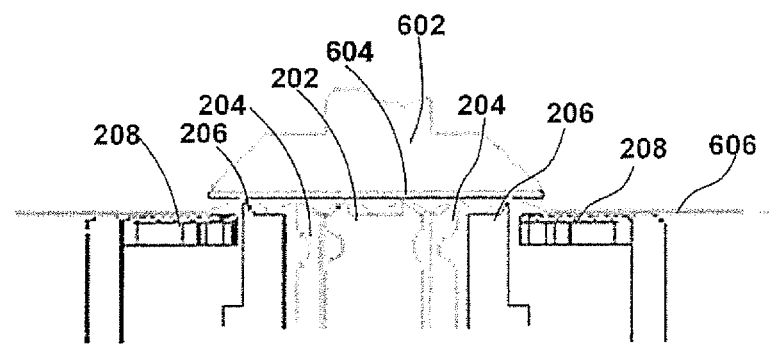
Figure 10C:
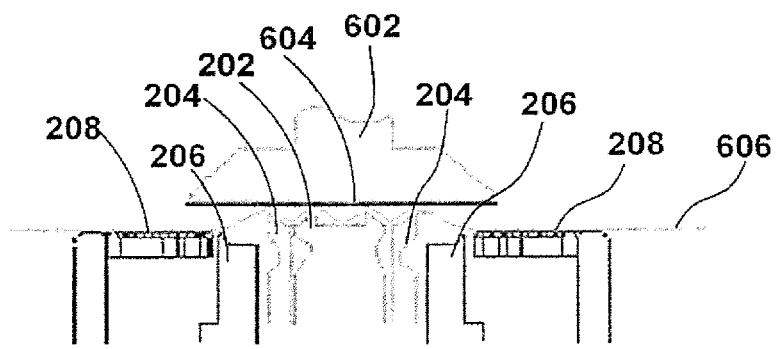
Figure 10D:
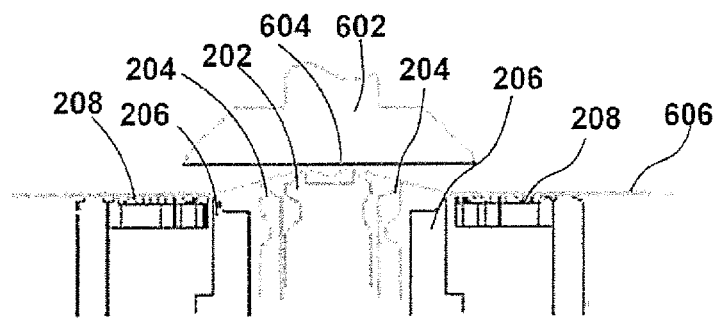
Figure 10E:
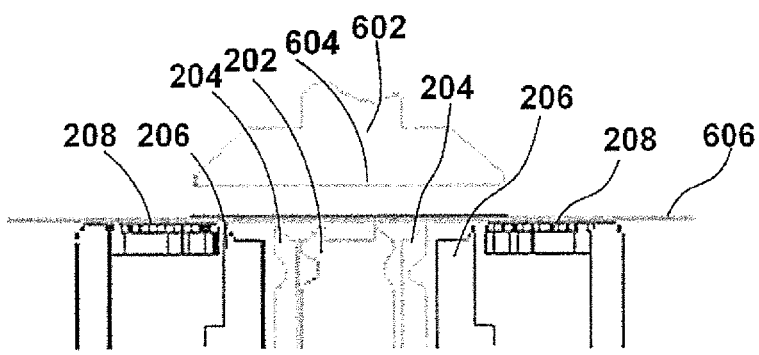

To commence the chip peeling process, the vacuum source (not shown) is turned ON. Then, as depicted in FIG. 10B, the inner set, middle set and outer set of contacts 202, 204 and 206 respectively are moved up slowly by a first predefined distance along with the pickup and place unit 602. Due to the vacuum suction, the tape remains adhered to the flat portions on the surface of the inner set, middle set and outer set of contacts 202, 204 and 206 respectively. Thus, after the inner set, middle set and outer set of contacts 202, 204 and 206 respectively are moved up, the tape 606 is loosened from the bottom surface of the chip 604 at a number of portions, namely, the inner ends of the vacuum channels 208, the ends of the chip 604 and the flat portions on the surface of the inner set, middle set and outer set of contacts 202, 204 and 206 respectively. In FIG. 10C, the outer set of contacts 206 is moved down by the first predefined distance and middle and inner set of contacts 202 and 204 are moved up by second predetermined distance. Due to this, the portion of the tape 606 corresponding to the width of the outer set of contacts 206 and the ends of the chip 604 is peeled off from the bottom surface of the chip 604. Thereafter, the inner set of contacts 202 is moved up by the third predefined distance to loosen the tape 606 further from the bottom surface of the chip 604 as depicted in FIG. 10D. Finally, as depicted in FIG. 10E, the inner set of contacts 202 and middle set of contact 204 are moved down to the same position as in non-activated state, thereby, removing the tape 606 from the bottom surface of the chip 604 and the pickup and place unit 602 collects the chip 604 without damage.

It should be noted that the steps involved in FIGS. 8A-8E and in FIGS. 10A-10E are same but in FIGS. 8A-8E, the inner set, middle set and outer set of contacts 202, 204 and 206 respectively are pins whereas FIGS. 10A-10E the inner set, middle set and outer set of contacts 202, 204 and 206 respectively are one or more needles.

Figure 11:
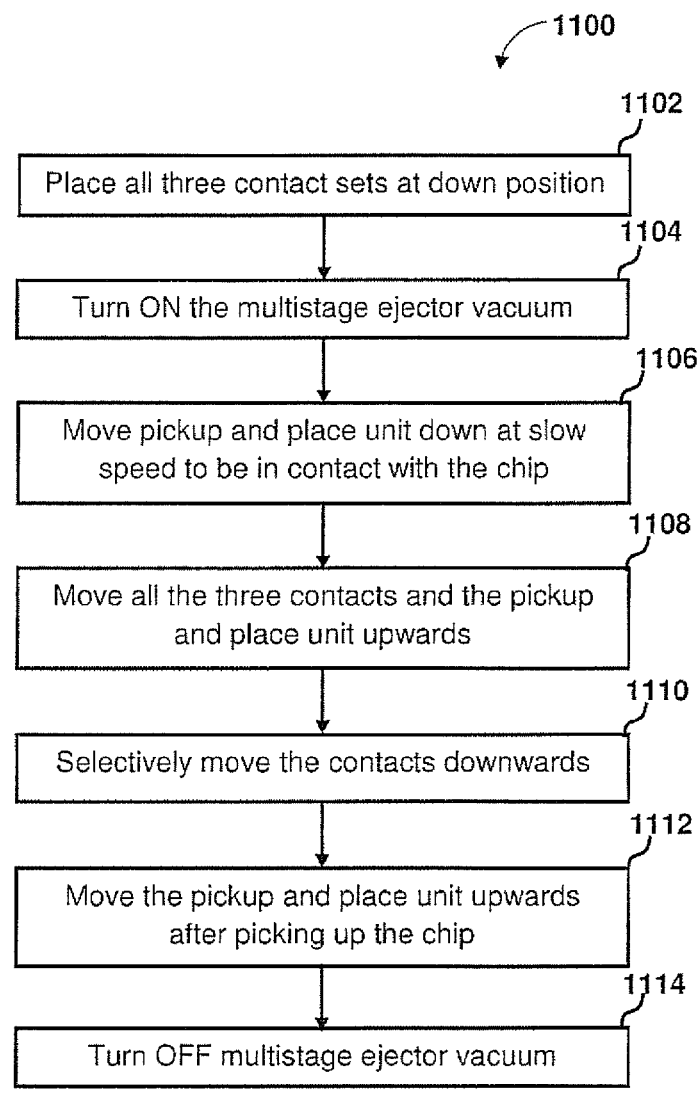
FIG. 11 is an illustration of a flow chart pertaining to one method of peeling a semiconductor chip from a tape, in accordance with the disclosed embodiments.

FIG. 11 is an illustration of a flow chart 1100 pertaining to one method of peeling a semiconductor chip from a tape, in accordance with the disclosed embodiments. At block 1102, the inner set, middle set and outer set of contacts are kept at a down or non-activated position below the tape to which a semiconductor chip is attached on the opposite side. The tape is thus sandwiched between the chip and the plural sets of the tape removing pins. In this position, the inner set, middle set and outer set of contacts are at the same level as the top surface of a housing. Then, a vacuum source of the multistage ejector is turned on as depicted at block 1104. Vacuum is created to hold the tape firmly to the top surface of the housing. A pickup and place unit is slowly coupled to the free end of the chip as said at block 1106. It should be noted that, the multistage ejector is utilized to loosen or remove the tape under the bottom surface of the chip after performing various pin movements and then the pickup and place unit can easily remove the chip from the tape as described in steps below.

Then, as depicted at block 1108, the inner set, middle set and outer set of contacts are moved up slowly along with the pickup and place unit by a first predefined distance. This loosens the tape at ends of the chip. At block 1110, at least one set of the plural sets of tape removing contacts is selectively moved downwards to effectively loosen the tape from the chip in steps. For example, in FIGS. 6C-6E, first the outer set of contacts is moved downwards followed by middle set of contacts and finally the inner set of contacts respectively. Block 1110 has been explained with reference to three sets of contacts, however, it is possible if there are more sets of contacts, two or more sets can be moved down in one step. Block 1110 is repeated till all the sets of the plural sets of tape removing contacts are moved downwards by the first predefined distance.

Then, at block 1112, the pickup and place unit removes the chip slowly and the vacuum source is turned off at block 1114.

Figure 12:
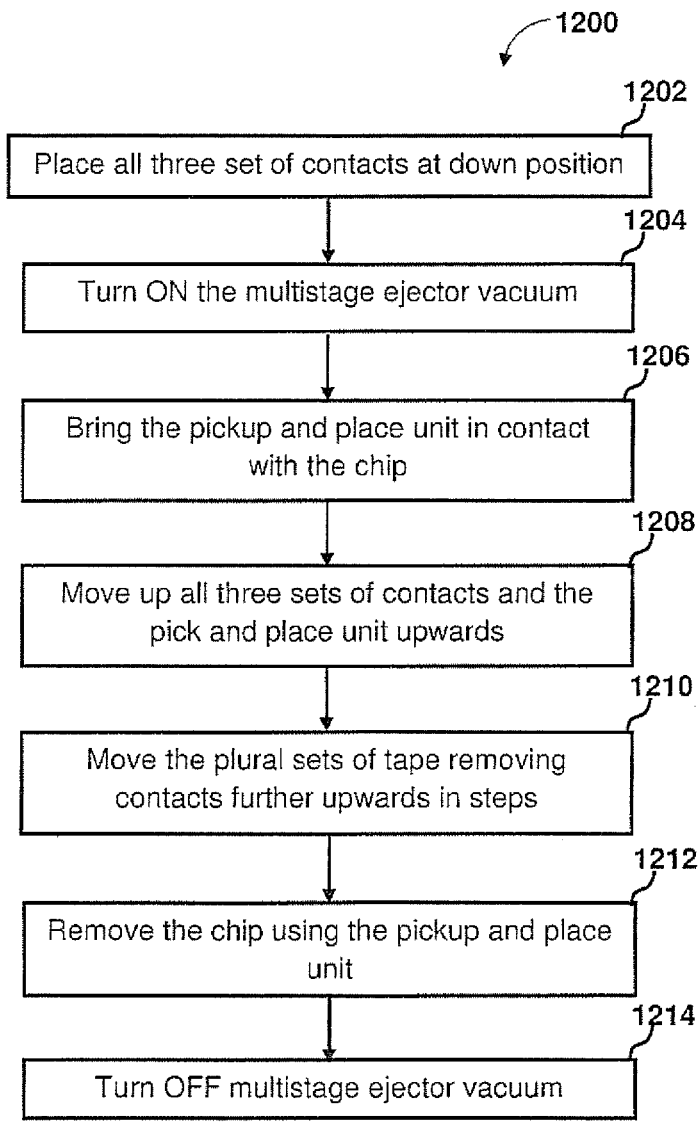
FIG. 12 is an illustration of a flow chart pertaining to another method of peeling a semiconductor chip from a tape, in accordance with the disclosed embodiments.

FIG. 12 is an illustration of a flow chart 1200 pertaining to an alternate method of peeling a semiconductor chip from a tape, in accordance with the alternate embodiments. At block 1202, the inner set, middle set and outer set of contacts are kept at a down or non-activated position below the tape to which a semiconductor chip is attached on the opposite side. The tape is thus sandwiched between the chip and the plural sets of the tape removing pins. A vacuum source in the multistage ejector is turned on at block 1204. Vacuum is created to hold the tape firmly to the top surface of the housing. A pickup and place unit is slowly coupled to the free end of the chip as said at block 1206. Then, at block 1208, the inner set, middle set and outer set of contacts are moved up slowly by a first predefined distance along with the pickup and place unit. This loosens the tape at the ends of the chip.

As shown at block 1210, the plural sets of tape removing contacts are moved further upwards in steps of second predefined distance. In each such step, the number of plural sets of tape removing contacts is reduced by one compared to the previous step. For example (also depicted in FIGS. 7C-7E), the inner and middle set of contacts are moved further upwards by the second predefined distance along with the pickup and place unit to loosen the tape attached to the chip. Then, the inner set of contacts are moved up alone by a third predetermined distance to further loosen the tape. Thus, in each of the two steps, every subsequent upward movement of the sets had one set less than the previous one. FIGS. 8C-8E and FIGS. 10C-10E are exemplary illustration of blocks 1208 and 1210. Finally, at block 1212, the pickup and place unit picks the chip and moves slowly after picking the chip and at 1214 the vacuum source is turned off.

Figure 13:
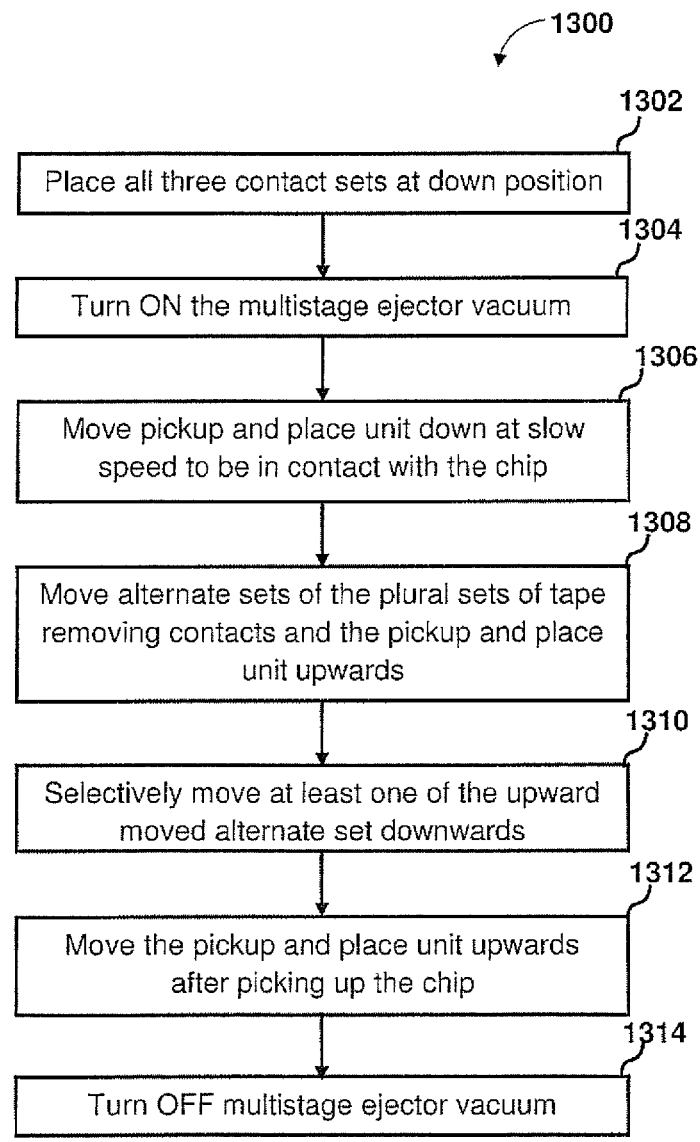
FIG. 13 is an illustration of a flow chart pertaining to yet another method of peeling a semiconductor chip from a tape, in accordance with the disclosed embodiments.

FIG. 13 is an illustration of a flow chart 1300 pertaining to yet another method of peeling a semiconductor chip from a tape, in accordance with the disclosed embodiments. At block 1302, the inner set, middle set and outer set of contacts are kept at a down or non-activated position below the tape to which a semiconductor chip is attached on the opposite side. The tape is thus sandwiched between the chip and the plural sets of the tape removing pins. Then, a vacuum source of the multistage ejector is turned on as depicted at block 1304. Vacuum is created to hold the tape firmly to the top surface of the housing. A pickup and place unit is slowly coupled to the free end of the chip as said at block 1306.

Then, as depicted at block 1308, alternate sets of the plural sets of tape removing contacts are moved upwards by the first predefined distance. For example, as shown in FIG. 9B, the inner set and outer set of contacts are moved up slowly by the first predefined distance. This loosens the tape at ends of the chip. Also, the pickup and place unit is moved upwards by the same distance simultaneously. At block 1310, at least one set of the upward moved alternate sets of the plural sets of tape removing contacts is moved downwards and simultaneously other set of the upward moved alternate sets of the plural sets of tape removing contacts is moved upward by a second predetermined distance to effectively loosen the tape from the chip in steps. For example, in FIGS. 9C and 9E the outer set and the inner set of contacts are moved down respectively. This process is repeated till all the upward moved alternate sets of the plural sets of tape removing contacts are moved downwards. Optionally, for example, as shown in FIG. 9D, the middle set of contacts may be moved upwards before the inner set of contacts is moved downwards to hold the loose tape firmly due to suction effect applied through the middle set.

Then, at block 1312, the pickup and place unit removes the chip slowly and the vacuum source is turned off at block 1314.

It will be appreciated that variations of the above disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

Although embodiments of the current disclosure have been described comprehensively in considerable detail to cover the possible aspects, those skilled in the art would recognize that other versions of the disclosure are also possible.

What is claimed is:

1. A system for peeling a semiconductor chip from a tape comprising:
    a housing having a top surface, wherein the top surface is positioned under the tape on which the chip is attached;
    an inner set of tape removing contacts located at the center of the top surface of the housing;
    a middle set of tape removing contacts surrounding the inner set of tape removing contacts;
    an outer set of tape removing contacts surrounding the middle set of tape removing contacts,
    a plurality of vacuum channels surrounding the inner, middle and outer sets of tape removing contacts;
    a vacuum source coupled to the plurality of vacuum channels for creating a vacuum to hold the tape; and
    a controller for controlling the vacuum source and the inner, middle and outer sets of tape removing contacts,
    wherein each set of the inner, middle and outer sets of tape removing contacts is capable of moving independently or together with other sets;
    wherein the controller triggers individual or collective movement of the inner, middle and outer set of tape removing contacts;
    wherein the chip is removed from the tape due to movement of the inner, middle and outer sets of tape removing contacts after the vacuum source is activated;
    wherein an actuation mechanism and the controller independently control movements of each set of tape removing contacts;
    wherein each set of the inner, middle and outer sets of tape removing contacts is coupled to a respective actuation mechanism that facilitates the movement of tape removing contacts based upon a trigger received from the controller; and
    wherein the tape removing contacts are pins or needles.

2. The system of claim 1, wherein the inner set of tape removing contacts has a first shaped contact area, the middle set of tape removing contacts has a second shaped contact area and the outer set of tape removing contacts has a third shaped contact area.

3. The system of claim 1, further comprising a pickup and place unit operatively coupled to the free surface of the chip, wherein the pickup and place unit removes the chip from the tape once the chip is loosened from the tape.

4. The system of claim 1, wherein the housing comprises a pepper pot.

5. The system of claim 1, wherein the plurality of vacuum channels are concentric.

6. A method for peeling a semiconductor chip from a tape comprising the steps of:
    placing an inner set, a middle set and an outer set of tape removing contacts under the tape on which the chip is attached;
    coupling a pickup and place unit to the free surface of the chip;
    activating a controller to operate a vacuum in conjunction with an actuator mechanism;
    creating a vacuum for holding the tape to the top surface of a housing;
    moving the inner, middle and outer sets of tape removing contacts upward by a first predefined distance;
    simultaneously, moving the pickup and place unit upward by the first predefined distance;
    moving the outer sets of tape removing contacts downward;
    moving subsequently the middle set of tape removing contacts downward;

moving thereafter the inner set of tape removing contacts downward, leaving the chip coupled to the pickup and place unit; and removing the chip using the pickup and place unit after all of the sets of tape removing contacts are moved downward;

wherein the actuation mechanism and controller independently control movements of each set of tape removing contacts;

wherein each set of the inner, middle and outer sets of tape removing contacts is coupled to a respective actuation mechanism that facilitates the movement of tape removing contacts based upon a trigger received from the controller; and wherein the tape removing contacts are pins or needles.

7. The method of claim 6, wherein the moving of each set of the tape removing contacts are under the control of the controller.

8. The method of claim 6, further comprising the step of turning off the vacuum after the chip is removed.

9. A method for peeling a semiconductor chip from a tape, comprising the steps of:

placing an inner, middle and outer set of tape removing contacts under the tape on which the chip is attached;

coupling a pickup and place unit to the free surface of the chip;

activating a controller to operate a vacuum in conjunction with an actuator mechanism;

creating a vacuum for holding the tape to the top surface of a housing;

moving the each sets of tape removing contacts upward by a first predefined distance while simultaneously moving the pickup and place unit upward by the first predefined distance;

moving upward the middle and inner sets of tape removing contacts by a second predefined distance while simultaneously moving the pickup and place unit upward by the second predefined distance;

moving upward the inner set of tape removing contacts by a third predefined distance while simultaneously moving the pickup and place unit upward by the third predefined distance; and removing the chip using the pickup and place unit when only one set of tape removing contacts is attached to the tape;

wherein the actuation mechanism and controller independently control movements of each set of tape removing contacts;

wherein each set of the inner, middle and outer sets of tape removing contacts is coupled to a respective actuation mechanism that facilitates the movement of tape removing contacts based upon a trigger received from the controller; and wherein the tape removing contacts are pins or needles.

10. The method of claim 9, further comprising the step of turning off the vacuum after the chip is removed.

11. A method for peeling a semiconductor chip from a tape, the method comprising the steps of:

placing an inner set, middle set and outer set of tape removing contacts under the tape on which the chip is attached;

coupling a pickup and place unit to the free surface of the chip;

creating a vacuum for holding the tape firmly to the top surface of a housing;

moving the outer and inner sets of tape removing contacts upwards by a first predefined distance;

simultaneously, moving the pickup and place unit upwards by the first predefined distance;

selectively moving one set of the outer and inner sets of tape removing contacts downward by the first predefined distance and the other set of the outer and inner sets of tape removing contacts upward by a second predefined distance while simultaneously moving the pickup and place unit upward by the second predefined distance;

moving the middle set of tape removing contacts upward by a third predefined distance while simultaneously moving the pickup and place unit upward by the third predefined distance to loosen the tape from the chip; and removing the chip using the pickup and place unit;

wherein an actuation mechanism and controller independently control movement of each set of tape removing contacts;

wherein each set of the inner, middle and outer sets of tape removing contacts is coupled to a respective actuation mechanism that facilitates the movement of tape removing contacts based upon a trigger received from the controller; and wherein the tape removing contacts are pins or needles.

* * * * *